(12) United States Patent
Lynch et al.

(10) Patent No.: US 7,554,812 B2
(45) Date of Patent: Jun. 30, 2009

(54) STRUCTURAL SUPPORT FOR PORTABLE ELECTRONIC DEVICES

(75) Inventors: Brian Lynch, Cupertino, CA (US); Jan Moolsintong, Cupertino, CA (US); Stephen Zadesky, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 540 days.

(21) Appl. No.: 11/352,503

(22) Filed: Feb. 10, 2006

(65) Prior Publication Data

US 2007/0081318 A1 Apr. 12, 2007

Related U.S. Application Data

(60) Provisional application No. 60/725,842, filed on Oct. 11, 2005.

(51) Int. Cl.
*H05K 1/14* (2006.01)
(52) U.S. Cl. .................. 361/736; 361/800; 361/727
(58) Field of Classification Search ................ 361/752, 361/790, 797, 800; 312/223; 455/575
See application file for complete search history.

(56) References Cited

U.S. PATENT DOCUMENTS 5,333,100 A * 7/1994 Anhalt et al. ............... 361/818
5,373,149 A * 12/1994 Rasmussen ................. 235/492
6,850,413 B2 * 2/2005 Amie et al. ................. 361/737
6,914,773 B2 * 7/2005 Yang et al. ................. 361/681
2002/0126466 A1 * 9/2002 Suzuki et al. ............... 361/818

* cited by examiner

*Primary Examiner*—Hung S Bui
(74) *Attorney, Agent, or Firm*—IP Strategy Group, P.C.

(57) ABSTRACT

Parallel stacking mid-frame structural supports for use with a portable electronic device are presented including: a first side member; a second side member disposed substantially parallel to the first side member, the first member and the second member each configured with; a support feature for providing structural support when an applied load exceeding a predetermined threshold is exerted on the portable electronic device, and an attachment feature; a third side member mechanically contiguous with and disposed substantially perpendicular to the first side member; and a fourth side member mechanically contiguous with and disposed substantially perpendicular to the first side member. In some embodiments, the mid-frame structural support also includes: a first number of rib supports for supporting a printed circuit board (PCB), and a second number of rib supports for supporting the PCB. In some embodiments, the predetermined threshold is approximately 800 grams.

19 Claims, 5 Drawing Sheets

STRUCTURAL SUPPORT FOR PORTABLE ELECTRONIC DEVICES

PRIORITY CLAIM TO PROVISIONAL APPLICATION

A claim for priority is hereby made under the provisions of 35 U.S.C. § 119 for the present application based upon U.S. Provisional Application No. 60/725,842, filed on Oct. 11, 2005.

BACKGROUND

Portable electronic device have proliferated modern society. Cell phones, computing devices, personal digital assistants, MP3 players and the like are now commonplace electronics having generous amounts of computing power packaged in ever shrinking device profiles. The ability to package devices in smaller and smaller profiles is due at least in part to shrinking electronic components. Thus, the space necessary to house a sufficient number of electronic components to enable such complex devices continues to diminish. However, as the push for smaller device profiles continues, structural considerations become increasingly important.

When electronic devices were first introduced to modern markets, size was not a primary concern. Bulky devices utilizing tubes instead of solid state electronic components were commonplace. Even with the introduction of smaller electronic components like transistorized circuits, device profiles often lagged behind technological developments often resulting in devices filled mostly with air. Once new applications for electronic devices began to surge forward, demands for smaller devices ensued. Now, a portable music device, for example, may hold thousands of songs in a device profile no larger than a disposable lighter. With smaller profiles, component stacking and material selection has become more critical.

Typically, electronic devices are composed of many elements that may be serially stacked in a package. In one example, a keyboard may be stacked with a printed circuit board (PCB), a chassis, and bezel or cover plate. Stacking components generally allows a smaller profile in both x and y directions, but may lead to increased thickness in a z direction. In attempting to reduce profiles in a z direction, increasingly thinner material thicknesses may be utilized. However, thinning materials may lead to a corresponding diminishment of torsional and flexural rigidity in an electronic device. Prior art solutions have led to the development of mid-frame structural supports which may be serially stacked and may provide some needed rigidity to a device. However, serial stacking may not always result in a lower profile in a z direction because any thinning of materials may be offset by a structural support element that might be required in an electronic device. As such, parallel configurations of structural supports for portable electronic devices are presented herein.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented below.

Parallel stacking mid-frame structural supports for use with a portable electronic device are presented including: a first side member; a second side member disposed substantially parallel to the first side member, the first member and the second member each configured with; a support feature for providing structural support when an applied load exceeding a predetermined threshold is exerted on the portable electronic device, and an attachment feature; a third side member mechanically contiguous with and disposed substantially perpendicular to the first side member; and a fourth side member mechanically contiguous with and disposed substantially perpendicular to the first side member. In some embodiments, the mid-frame structural support also includes: a first number of rib supports for supporting a printed circuit board (PCB), the first number rib supports disposed substantially perpendicular to the first side member and the second side member; and a second number of rib supports for supporting the PCB, the second number of rib supports disposed substantially parallel to the first side member and the second side member wherein the first number of rib supports and the second number of rib supports define a plurality of openings configured to surround a plurality of electronic components on the PCB. In some embodiments, the predetermined threshold is approximately 800 grams.

In other embodiments, a portable electronic device is presented including: a base having a snap-weldment feature; a bezel for enclosing the base, the bezel configured to receive the snap-weldment feature such that the bezel is retained by the snap-weldment feature; a printed circuit board (PCB) for mounting a plurality electronic components in the base; an a parallel stacking mid-frame structural support for structurally supporting the bezel and the PCB, the parallel stacking mid-frame structural support including, a first side member, a second side member disposed substantially parallel to the first side member, the first member and the second member each configured with, a support feature for providing structural support when an applied load exceeding a predetermined threshold is exerted on the portable electronic device, and an attachment feature, a third side member mechanically contiguous with and disposed substantially perpendicular to the first side member, and a fourth side member mechanically contiguous with and disposed substantially perpendicular to the first side member. In some embodiments, the predetermined threshold is approximately 800 grams.

In other embodiments, a parallel stacking mid-frame structural support for use with a portable electronic device is presented including: a first member means; a second member means disposed substantially parallel to the first member means, the first member means and the second member means each configured with; a means for providing structural support when an applied load exceeding a predetermined threshold is exerted on the portable electronic device, and a means for attaching the first member means and the second member means with a bezel; a third member means mechanically contiguous with and disposed substantially perpendicular to the first member means; and a fourth member means mechanically contiguous with and disposed substantially perpendicular to the first member means. In some embodiments, the mid-frame structural support also includes: a first support means for supporting a printed circuit board (PCB) disposed substantially perpendicular to the first member means and the second member means; and a second support means for supporting the PCB disposed substantially parallel to the first member means and the second member means wherein the first support means and the second support means define a plurality of openings configured to surround a plurality of electronic components on the PCB.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
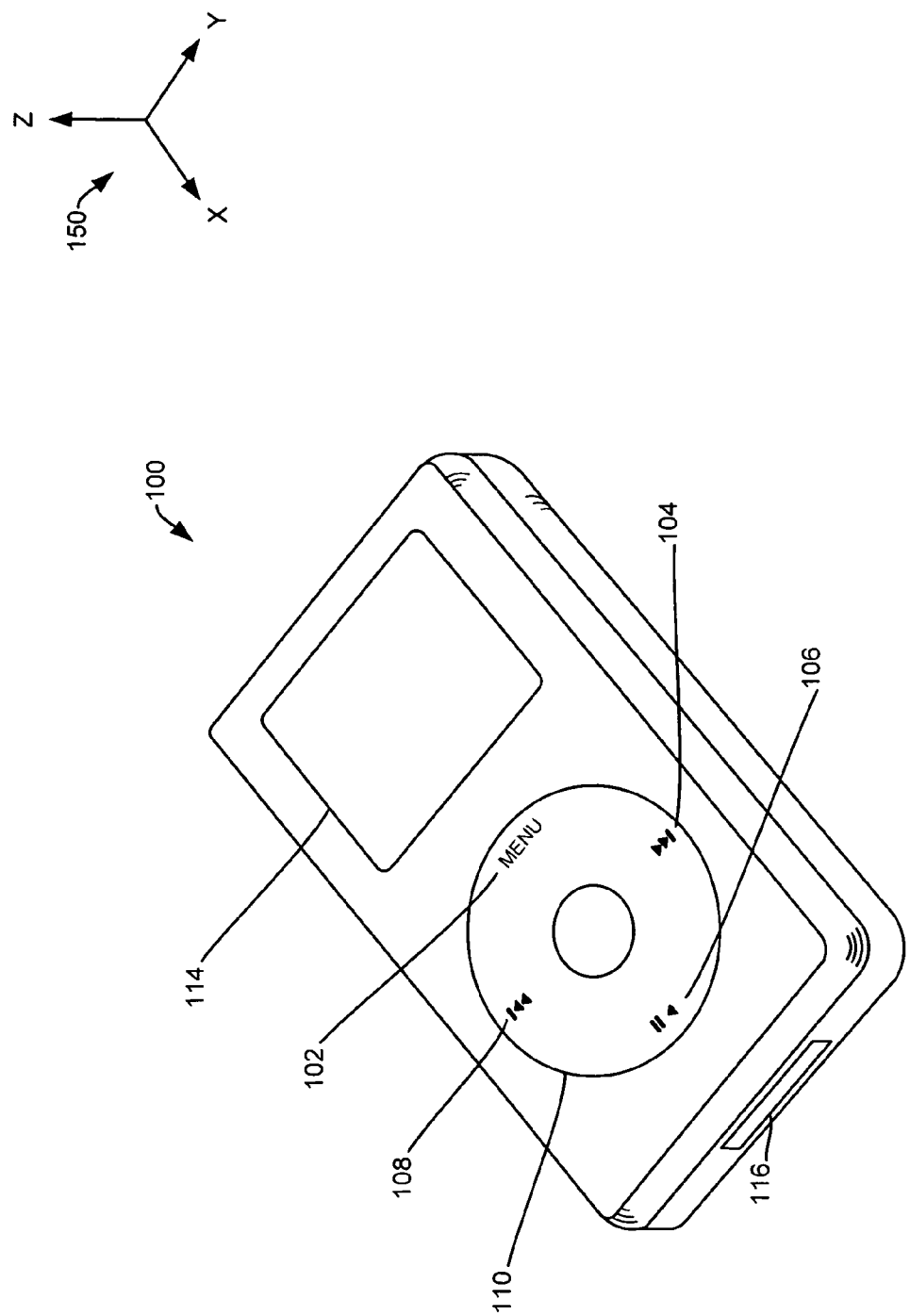
FIG. 1 is an illustrative representation of a portable electronic music device in accordance with an embodiment of the present invention.

FIG. 1 is an illustrative representation of a portable electronic music device 100 in accordance with an embodiment of the present invention. A user may store and play any number of musical selections using device 100. One example of a portable electronic music device is an IPOD™ by APPLE™. In some examples, a screen 114 may be provided that may be utilized as a graphical user interface. A selection wheel 110 may provide any number of player controls 102-108 to provide a user friendly and efficient interface. In this example, a player control may be defined by an area that may be pressed to actuate an underlying switch. In some examples, a center button 112 having an underlying center button switch may be provided for additional selections. Further, a port 116 may be used for I/O functions as well as charging functions. Legend arrows 150 are provided for clarity. As illustrated, portable electronic music device 100 is configured with a simplified user interface having only four selection wheel controls (102-108) and one center button 112.

In making a user selection, a force may be applied by a stylus, pointer, or finger upon portable electronic music device 100. In examples where device profile is very thin, a user selection may cause flexure in the device. Flexure may lead to stress related failures of a printed circuit board (PCB) enclosed within a device. This is particularly true in examples utilizing PCB mounted switches because forces are continually being applied to a specific locus of a PCB. Without some form of strengthening of portable electronic music device 100 and an enclosed PCB, failure rates may rise to undesirable levels.

Figure 2:
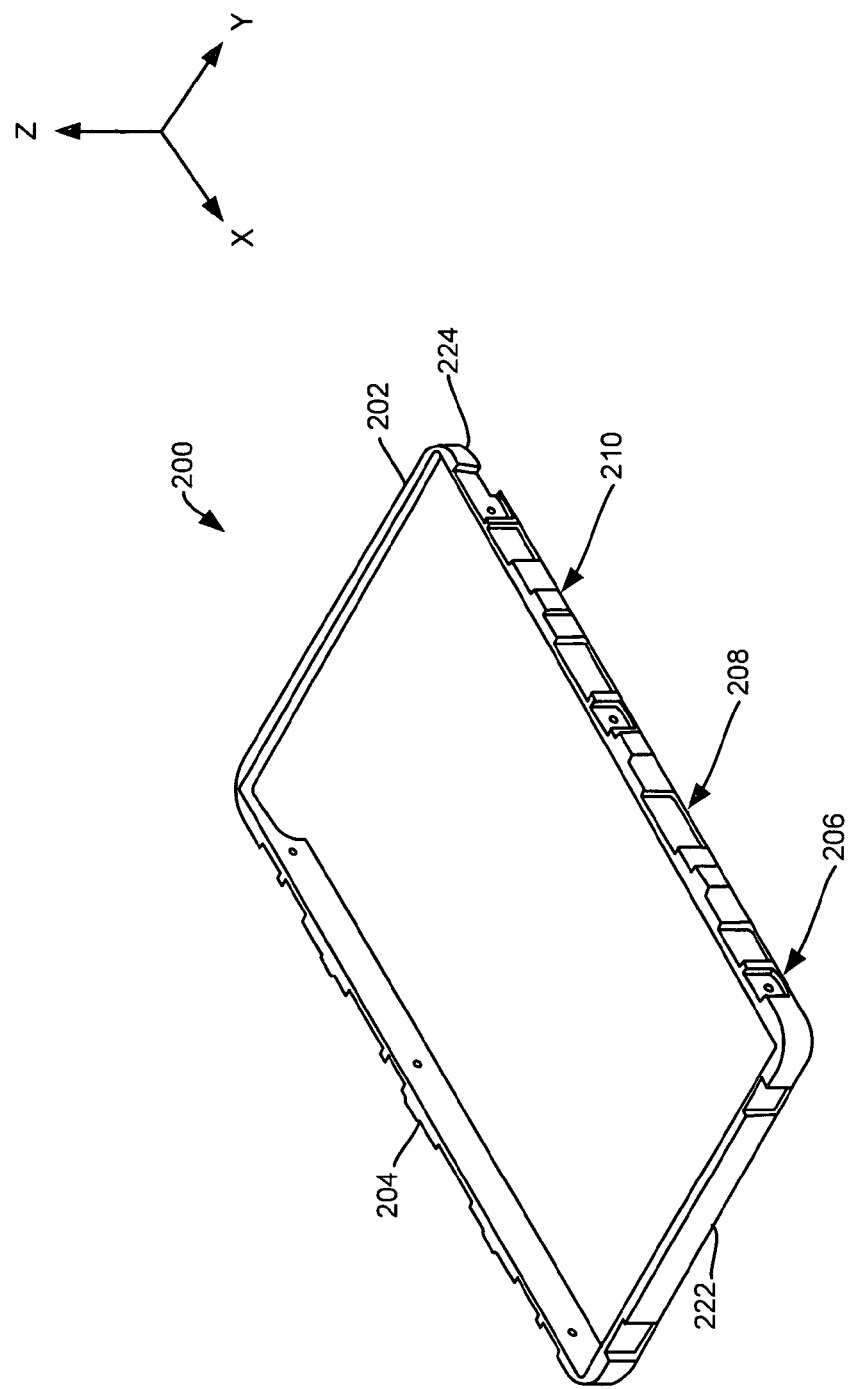
FIG. 2 is an illustrative orthogonal representation of a structural support in accordance with an embodiment of the present invention.

FIG. 2 is an illustrative orthogonal representation of a mid-frame structural support 200 in accordance with an embodiment of the present invention. As noted above, a mid-frame structural support may add needed rigidity to a portable electronic device. In a parallel stacking embodiment, mid-frame structural support 200 does not add to a device thickness profile thus allowing for thinner devices. Parallel stacking refers to a stacking scheme that does not add thickness to a stack when adding a component. In contrast, serial stacking refers to a stacking scheme that adds thickness to a stack when adding a component. As such, mid-frame structural support 200 is configured with side members 202/222 which may be mechanically contiguous with side members 204/224. In some embodiments, side members 202/222 and 204/224 may be disposed substantially perpendicular with respect to each other. In other embodiments, side members 202/222 and 204/224 may be disposed in an arrangement consistent with the shape of a supported enclosure. In some embodiments, side members 204 and 224 are configured as mirror images of each other. In still other embodiments, each side member may be unique in configuration. As can be appreciated, sizing of side members 202/222 and 204/224 is consistent with rigidity, material selection, and enclosure size requirements. For example, in some embodiments, a non-conduction metallic compound may be utilized to construct side members. In other embodiments, a non-conducting polymeric compound may be utilized. Mid-frame structural support 200 may be configured with any number of features including an attachment feature 206, a support feature 208, and a snap-weldment feature cavity 210. These features will be discussed in further detail below for FIG. 3.

Figure 3:
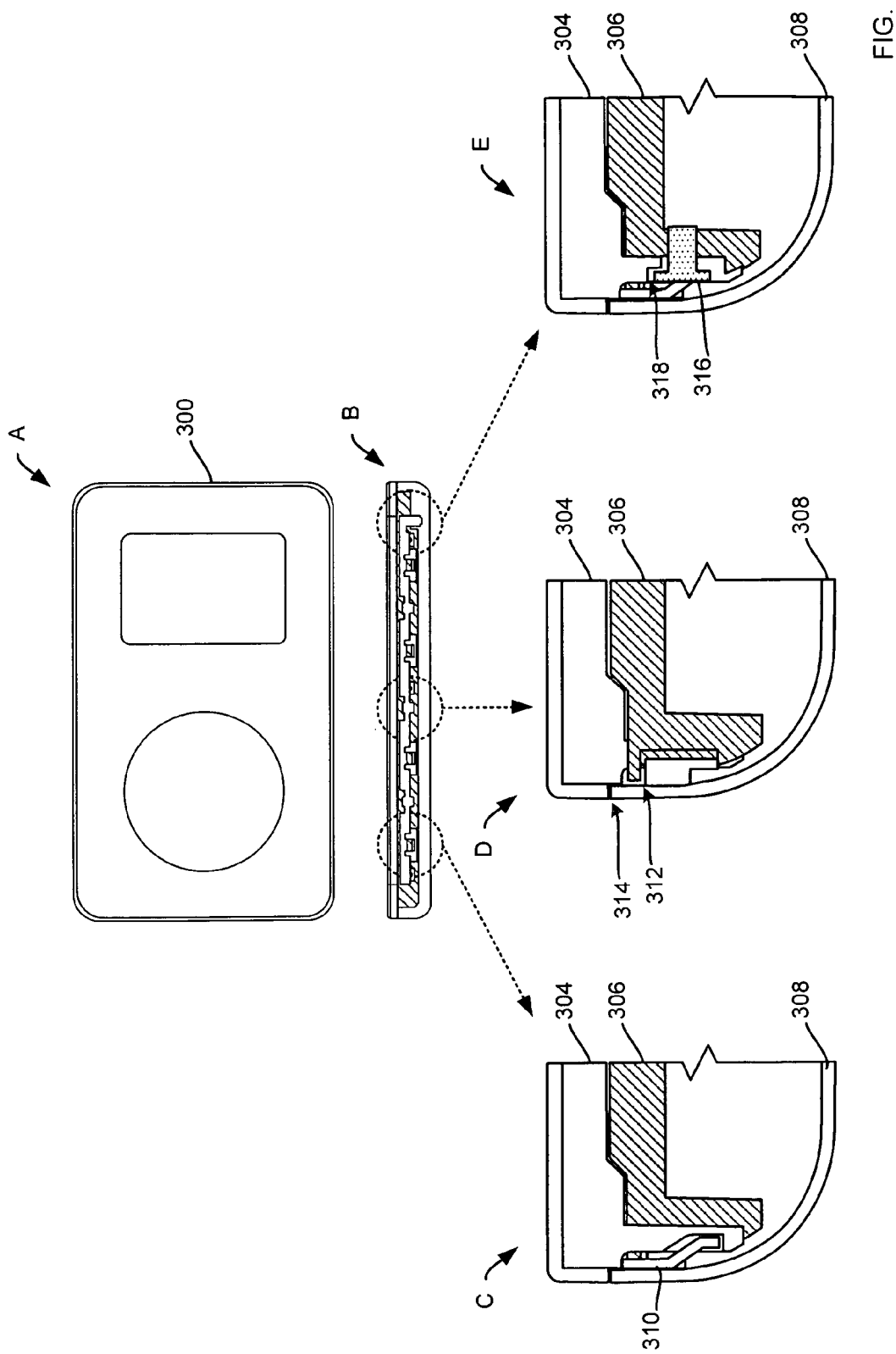
FIG. 3 is an illustrative representation of a structural support in accordance with an embodiment of the present invention.

FIG. 3 is an illustrative representation of a mid-frame structural support 306 in accordance with an embodiment of the present invention. Top view A of portable electronic device 300 is illustrated for clarity and reference. Likewise, side view B illustrates a cross-sectional view pointing out location of various features of mid-frame structural support 306. Cross-sectional view C illustrates an example of a snap-weldment feature 310 that may be used to capture bezel 304 in accordance with an embodiment of the present invention. Snap-weldment feature 310 is attached with base 308. Snap-weldment feature may be attached in any manner well-known in the art. Snap-weldment feature 310 may be composed of a resilient material such as spring steel that maintains tension on bezel 304. Snap-weldment feature 301 may be further configured to align bezel 304 in a ±z direction. As noted above, mid-frame structural support 306 may be configured with a snap-weldment feature cavity (see 210, FIG. 2). By utilizing a snap-weldment feature cavity, mid-frame structural support 306 may be nested with bezel 304 without interfering with snap-weldment feature 310.

Cross-sectional view D illustrates an example of a support feature in accordance with an embodiment of the present invention. As illustrated, a nominal gap 312 is provided between mid-frame structural support 306 and base 308. Nominal gap 312 is closed only under loading. Thus, when a force applied to bezel 304 exceeds a predetermined threshold, nominal gap 312 closes so that mid-frame structural support 306 carries the load caused by the applied force. In some embodiments, the applied force is approximately 800 grams. In other embodiments, the applied force is less than 1500 grams. Nominal gap 312 also allows for tolerance discrepancies in stack buildup and further provides for a uniform cosmetic gap 314 to be maintained around the perimeter of device 300. Cross-sectional view E illustrates an example of an attachment feature in accordance with an embodiment of the present invention. As illustrated, an attachment means 316 may be utilized to attach bezel 304 with mid-frame structural support 306. As may be appreciated, attachment may be accomplished in any manner well-known in the art including, for example, a screw, a bolt, a rivet, and a pin. In some embodiments, mid-frame structural support 306 may be configured with a nominal attachment gap 318 to allow for tolerance discrepancies. As may be appreciated, illustrated drawings are intended for illustrative clarity and are not necessarily drawn to scale. Indeed, sizing requirements may be unique to any one portable electronic device design. Thus, the principles described herein are equally applicable to widely varying device designs and profiles.

Figure 4:
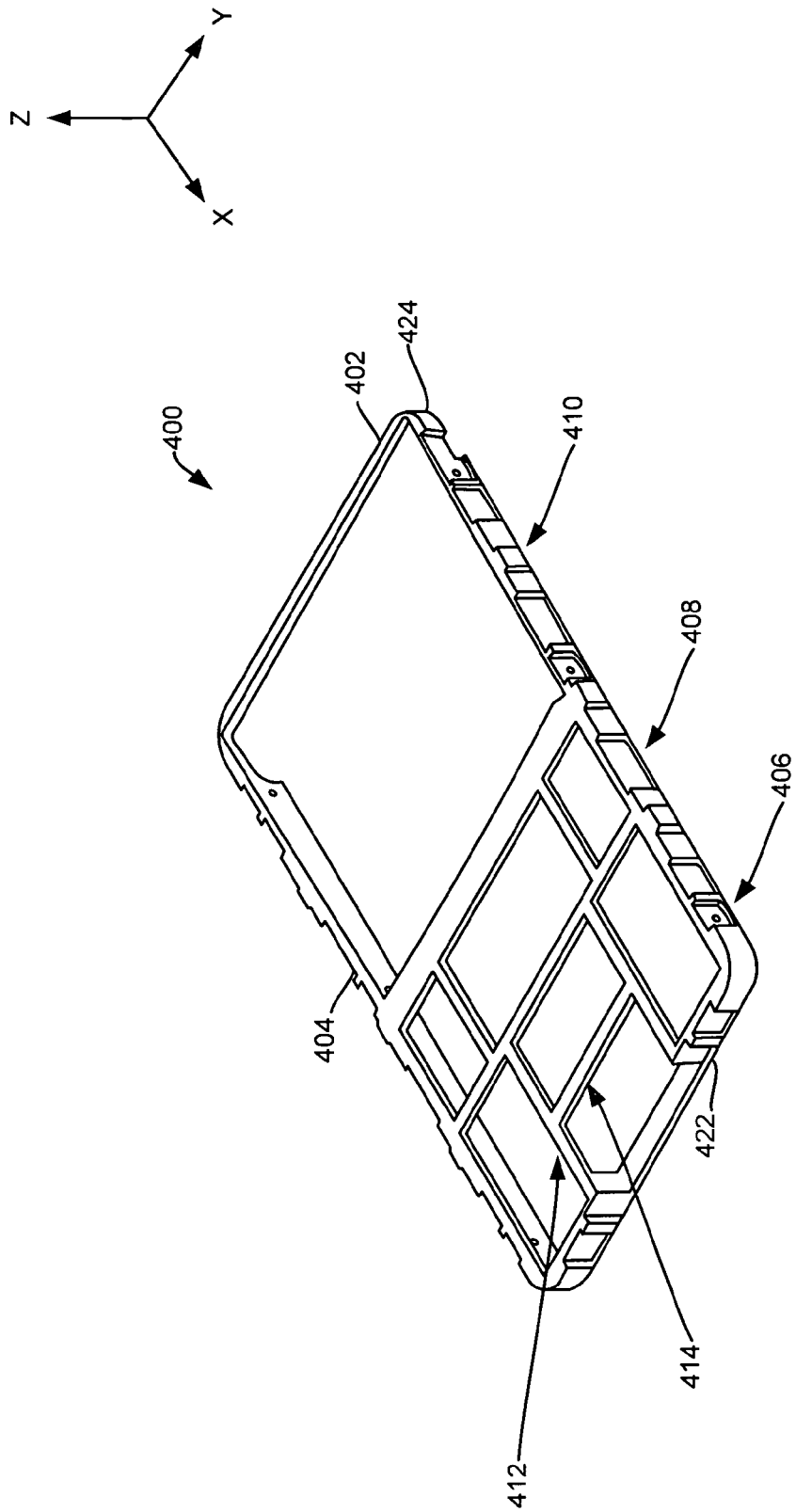
FIG. 4 is an illustrative orthogonal representation of a structural support with rib supports in accordance with an embodiment of the present invention.

FIG. 4 is an illustrative orthogonal representation of a mid-frame structural support 400 with rib supports 412-414 in accordance with an embodiment of the present invention. As noted above, a mid-frame structural support may add needed rigidity to a portable electronic device. In a parallel stacking embodiment, mid-frame structural support 400 does not add to a device thickness profile thus allowing for thinner devices. Parallel stacking refers to a stacking scheme that does not add thickness to a stack when adding a component. In contrast, serial stacking refers to a stacking scheme that adds thickness to a stack when adding a component. As such, mid-frame structural support 400 is configured with side members 402/422 which may be mechanically contiguous with side members 404/424.

In some embodiments, side members 402/422 and 404/424 may be disposed substantially perpendicular with respect to each other. In other embodiments, side members 402/422 and 404/424 may be disposed in an arrangement consistent with the shape of a supported enclosure. In some embodiments, side members 404 and 424 are configured as mirror images of each other. In still other embodiments, each side member may be unique in configuration. As can be appreciated, sizing of side members 402/422 and 404/424 is consistent with rigidity, material selection, and enclosure size requirements. For example, in some embodiments, a non-conduction metallic compound may be utilized to construct side members. In other embodiments, a non-conducting polymeric compound may be utilized. Mid-frame structural support 400 may be configured with any number of features including an attachment feature 406, a support feature 408, and a snap-weldment feature cavity 410. These features are discussed in further detail above for FIG. 3.

In addition, mid-frame structural support 400 may be configured with rib supports 412-414. In general, rib supports may be utilized to provide structural support for a PCB. As noted above, in some embodiments, a PCB mounted switch for user input may be provided. In those embodiments, stresses due to forces applied in actuating a PCB mounted switch may lead to stress related failures of the PCB. Thus, some support structures may be desirable to avoid such failures and correspondingly increase reliability. In some embodiments, rib support 414 may be disposed substantially perpendicular to side member 404/424 while rib support 412 may be disposed substantially parallel to side member 404/424. As may be appreciated rib supports may be configured to create a plurality of openings for surrounding any number of electronic components. In the example illustrated, rib support configuration is symmetrical to provide consistent stiffness throughout the structure. However, symmetry is not required. Indeed, any configuration for openings is possible utilizing embodiments of the present invention.

Figure 5:
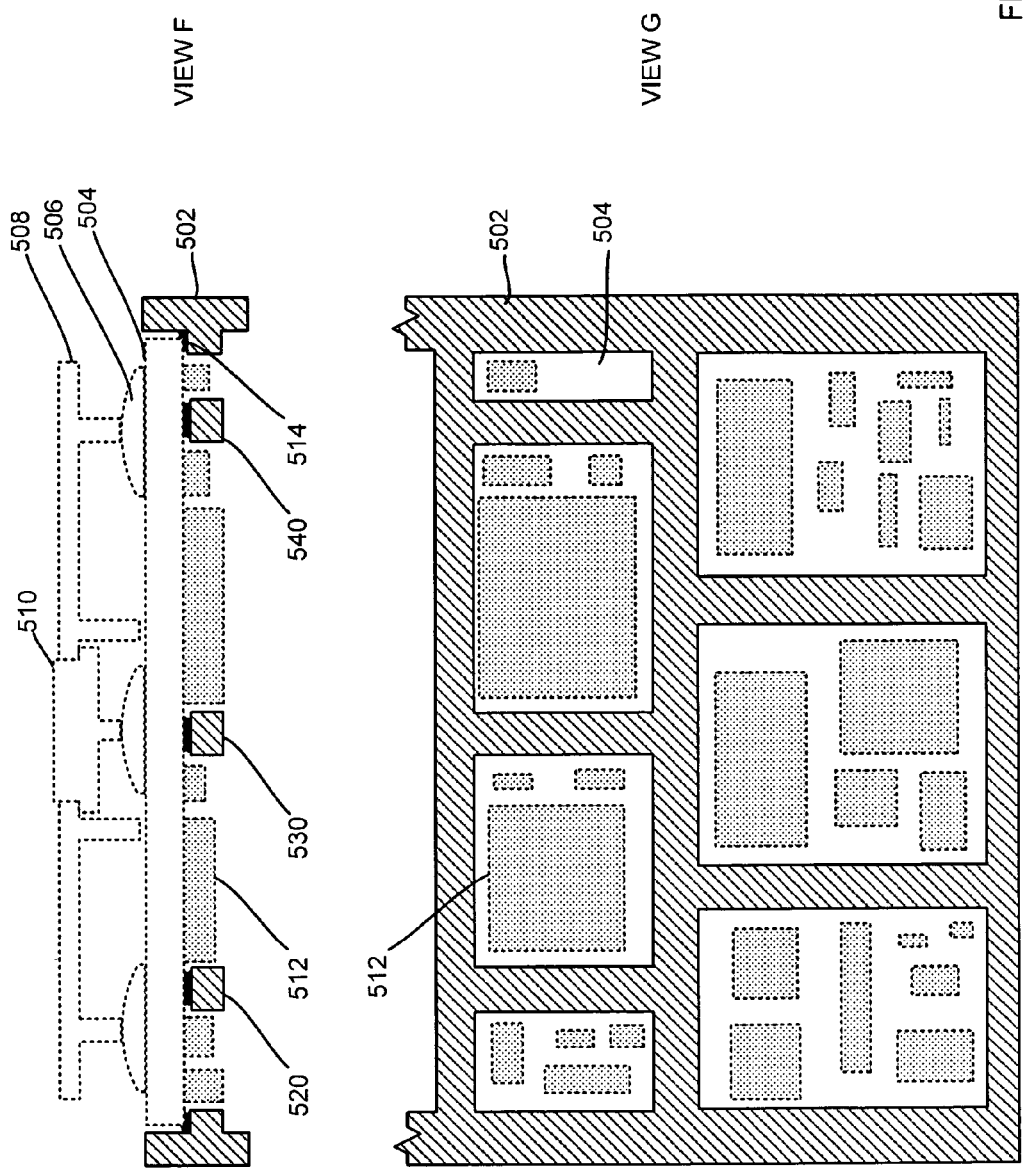
FIG. 5 is an illustrative representation of a structural support with rib supports in accordance with an embodiment of the present invention.

FIG. 5 is an illustrative representation of a structural support with rib support 502 in accordance with an embodiment of the present invention. For clarity, cross-sectional view F and top view G are aligned and illustrated. As noted above, a mid-frame structural support may add needed rigidity to a portable electronic device. In a parallel stacking embodiment, a mid-frame structural support does not add to a device thickness profile thus allowing for thinner devices. Parallel stacking refers to a stacking scheme that does not add thickness to a stack when adding a component. In other words, parallel stacking does not add to the z direction of a stack. In contrast, serial stacking refers to a stacking scheme that adds thickness to a stack when adding a component. Rib support 502 may add additional support for a portable electronic device PCB. Illustrated PCB 504 includes a number of PCB mounted switches such as PCB mounted switch 506. PCB mounted switch 506 may be actuated by a user exerting a force upon bezel 508 with a stylus, pointer, or finger. In some embodiments, an actuator button 510 distinct from bezel 508 may be employed to actuate a PCB mounted switch. Rib support 502 may be attached with PCB 504 in any manner well known in the art including gluing, bonding, taping, or otherwise attaching. In some embodiments, attachment material may be selected to provide vibration and mechanical shock protection. In other embodiments, attachment material may be selected to provide electronic insulation.

PCB 504 may be supported by portion 514 of rib support 502. At least two considerations for support should be accounted for in selecting a rib support configuration. First, as illustrated, rib support 502 may be configured so that support is co-located with or approximately co-located with a PCB mounted switch (see rib support portions 520-540). By co-locating or approximately co-locating rib support 502 with PCB mounted switches, forces used to actuate switches, which might typically result in stress related failures on PCB 504, may be mitigated. Forces may be mitigated because PCB 504, in utilizing embodiments of the present invention is not as prone to flexure or torsion due to user input. A second consideration for configuration is electronic component 512 location and density. Because rib structure 502 is intended for parallel stacking, care must be utilized in selecting a rib support opening configuration. Electronic component location may be configured to correspond to a selected rib support configuration; rib support may be configured to correspond to electronic component location; or any combination thereof. Thus, a particular configuration such as that illustrated should not be construed as limiting outside of the considerations already enumerated. As noted above, embodiments described herein allow for structural support without contributing to a z direction increase in thickness. In addition, some embodiments described herein also allow for structural support without contributing to x and y (i.e. length and width) directions because rib supports may be configured to lie between electronic components. Thus, structural support may be effectively added to a device with little or no impact on device size.

While this invention has been described in terms of several embodiments, there are alterations, permutations, and equivalents, which fall within the scope of this invention. It should also be noted that there are many alternative ways of implementing the methods and apparatuses of the present invention. For example, any number of rib supports may be utilized in accordance with embodiments of the present invention depending on electronic component location and density. Furthermore, although embodiments illustrated are generally rectangular in configuration, any shape corresponding to a selected electronic device may be utilized without departing from the present invention. It is therefore intended that the following appended claims be interpreted as including all such alterations, permutations, and equivalents as fall within the true spirit and scope of the present invention.

What is claimed is:

1. A parallel stacking mid-frame structural support for use with a portable electronic device, the portable electronic device including at least a printed circuit board (PCB), a switch mounted on the PCB, and a bezel that contacts the switch, the switch being disposed between the PCB and the bezel, the bezel including at least a control interface for receiving force applied by a user of the portable electronic device, the mid-frame structural support comprising:

a first side member, the first side member including at least a first portion for supporting the PCB, the switch and the PCB being disposed between the bezel and the first portion, the first portion receiving the force transmitted through the control interface, the switch, and the PCB when the control interface receives the force for actuating the switch to control at least an action of the portable electronic device;

a second side member disposed substantially parallel to the first side member, the first member and the second member each configured with at least one support feature for providing structural support for the portable electronic device when an applied load exceeding a predetermined threshold is exerted on the portable electronic device, and at least one attachment feature;

a third side member mechanically contiguous with and disposed substantially perpendicular to the first side member; and a fourth side member mechanically contiguous with and disposed substantially perpendicular to the first side member.

2. The mid-frame structural support of claim 1 wherein the at least one attachment feature is selected from the group consisting of: a screw, a bolt, a rivet, and a pin.

3. The mid-frame structural support of claim 1 further comprising:

a first plurality of rib supports for supporting the PCB, the first plurality of rib supports disposed substantially perpendicular to the first side member and the second side member; and a second plurality of rib supports for supporting the PCB, the second plurality of rib supports disposed substantially parallel to the first side member and the second side member wherein the first plurality of rib supports and the second plurality of rib supports define a plurality of openings configured to surround a plurality of electronic components on the PCB, the switch being disposed between the control interface and a portion of the second plurality of rib supports.

4. The mid-frame structural support of claim 3 wherein the first plurality of rib supports and the second plurality of rib supports are configured to provide support for a PCB mounted switch.

5. The mid-frame structural support of claim 1 wherein the mid-frame structural support is composed of a non-conducting metallic compound.

6. The mid-frame structural support of claim 1 wherein the mid-frame structural support is composed of a non-conducting polymeric compound.

7. The mid-frame structural support of claim 1 wherein the portable electronic device is a music device.

8. The mid-frame structural support of claim 1 wherein the predetermined threshold is at most 800 grams.

9. A portable electronic device for use by at least a user, the portable electronic device comprising:

a base having a snap-weldment feature;

a bezel for enclosing the base, the bezel configured to receive the snap-weldment feature such that the bezel is retained by the snap-weldment feature, the bezel including at least a control interface for receiving force applied by the user;

a printed circuit board (PCB) for mounting a plurality electronic components in the base;

a switch mounted on the PCB, the switch being disposed between the bezel and the PCB, the switch contacting the bezel; and a parallel stacking mid-frame structural support for structurally supporting the bezel and the PCB, the parallel stacking mid-frame structural support including, a first side member, the first side member including at least a first portion for supporting the PCB, the switch and the PCB being disposed between the bezel and the first portion, the first portion receiving the force transmitted through the control interface, the switch, and the PCB when the control interface receives the force for actuating the switch to control at least an action of the portable electronic device, a second side member disposed substantially parallel to the first side member, the first member and the second member each configured with at least one support feature for providing structural support for the portable electronic device when an applied load exceeding a predetermined threshold is exerted on the portable electronic device, and at least one attachment feature, a third side member mechanically contiguous with and disposed substantially perpendicular to the first side member, and a fourth side member mechanically contiguous with and disposed substantially perpendicular to the first side member.

10. The device of claim 9 wherein the parallel stacking mid-frame structural support is disposed with respect to the base such that a gap exists, the gap being configured to close when the applied load exceeds the predetermined threshold, the predetermined threshold being greater than zero gram.

11. The device of claim 9 further comprising:

a first plurality of rib supports for supporting the PCB, the first plurality of rib supports disposed substantially perpendicular to the first side member and the second side member; and a second plurality of rib supports for supporting the PCB, the second plurality of rib supports disposed substantially parallel to the first side member and the second side member wherein the first plurality of rib supports and the second plurality of rib supports define a plurality of openings configured to surround the plurality of electronic components on the PCB, the switch being disposed between the control interface and a portion of the second plurality of rib supports.

12. The device of claim 11 wherein the first plurality of rib supports and the second plurality of rib supports are configured to provide support for a PCB mounted switch.

13. The device of claim 9 wherein the mid-frame structural support is composed of a non-conducting metallic compound.

14. The device of claim 9 wherein the mid-frame structural support is composed of a non-conducting polymeric compound.

15. The device of claim 9 wherein the portable electronic device is a music device.

16. The device of claim 9 wherein the snap-weldment feature is composed of spring steel.

17. The mid-frame structural support of claim 9 wherein the predetermined threshold is less than 1500 grams.

18. A parallel stacking mid-frame structural support for use with a portable electronic device, the portable electronic device including at least a printed circuit board (PCB), a switch mounted on the PCB, and a bezel that contacts the switch, the switch being disposed between the PCB and the bezel, the bezel including at least a control interface for receiving force applied by a user of the portable electronic device, the mid-frame structural support comprising:

first member means, the first member means including at least a first portion for supporting the PCB, the switch and the PCB being disposed between the bezel and the first portion, the first portion receiving the force transmitted through the control interface, the switch, and the PCB when the control interface receives the force for actuating the switch to control at least an action of the portable electronic device;

second member means disposed substantially parallel to the first member means, the first member means and the second member means each configured with;

means for providing structural support when an applied load exceeding a predetermined threshold is exerted on the portable electronic device, and means for attaching the first member means and the second member means with a bezel;

third member means mechanically contiguous with and disposed substantially perpendicular to the first member means; and fourth member means mechanically contiguous with and disposed substantially perpendicular to the first member means.

19. The mid-frame structural support of claim 18 further comprising:

first support means for supporting a printed circuit board (PCB) disposed substantially perpendicular to the first member means and the second member means; and second support means for supporting the PCB disposed substantially parallel to the first member means and the second member means wherein the first support means and the second support means define a plurality of openings configured to surround a plurality of electronic components on the PCB, the switch being disposed between the control interface and a portion of the second support means.

\* \* \* \* \*